(12) United States Patent
Huebner

(10) Patent No.: US 6,325,421 B1
(45) Date of Patent: Dec. 4, 2001

(54) AUTHENTICITY ATTRIBUTE

(76) Inventor: Stefan Huebner, Brucknerstrasse 17, D-81677 Muenchen (DE)

( * ) Notice: Subject to any disclaimer, the term of this patent is extended or adjusted under 35 U.S.C. 154(b) by 0 days.

(21) Appl. No.: 09/367,084

(22) PCT Filed: Dec. 8, 1998

(86) PCT No.: PCT/DE98/03604

§ 371 Date: Nov. 8, 1999

§ 102(e) Date: Nov. 8, 1999

(87) PCT Pub. No.: WO99/30275

PCT Pub. Date: Jun. 17, 1999

(30) Foreign Application Priority Data

Dec. 10, 1997 (DE) ................................. 197 54 860

(51) Int. Cl.[7] ............................. G06K 7/10; G06K 19/06; G07C 9/00
(52) U.S. Cl. ................. 283/74; 283/53; 283/72; 283/75; 283/94; 283/904; 229/118; 229/160.2
(58) Field of Search .................. 283/53, 72, 74, 283/75, 94, 904; 229/118, 160.2

(56) References Cited

U.S. PATENT DOCUMENTS

| | | |
|---|---|---|
| 695,159 | 3/1902 | Lambert . |
| 2,042,736 | 6/1936 | Schwartz . |
| 2,164,663 | 7/1939 | Ottofy . |
| 2,822,425 | 2/1958 | Hicks . |
| 2,997,306 | * 8/1961 | Hicks ................................. 274/42 |
| 3,462,157 | 8/1969 | Barnett et al. . |
| 3,463,303 | 8/1969 | Gorman et al. . |
| 3,515,390 | 6/1970 | Ryan et al. . |
| 3,648,385 | 3/1972 | Barlow et al. . |
| 3,735,350 | 5/1973 | Lemelson . |
| 4,121,835 | 10/1978 | Garabedian . |
| 4,381,558 | 4/1983 | Bearden . |
| 4,631,715 | 12/1986 | Hoover . |
| 4,962,950 | 10/1990 | Champion . |

FOREIGN PATENT DOCUMENTS

| | | |
|---|---|---|
| 136 447 | 3/1902 | (DE) . |
| 202 594 | 10/1906 | (DE) . |
| G8612236.3 | 8/1986 | (DE) . |
| 36 16 469 | 11/1987 | (DE) . |
| 44 35 170 | 1/1996 | (DE) . |
| 296 14992 | 12/1996 | (DE) . |
| 298 07 972 | 10/1998 | (DE) . |
| 2 339 227 | 8/1977 | (FR) . |
| 1 511 377 | 5/1978 | (GB) . |
| WO99/09556 | 2/1999 | (WO) . |

* cited by examiner

Primary Examiner—Willmon Fridie, Jr.
Assistant Examiner—Mark T. Henderson
(74) Attorney, Agent, or Firm—Flynn, Thiel, Boutell & Tanis, P.C.

(57) ABSTRACT

The authenticity attribute for an object to be protected is formed by an elongate profile which produces characteristic oscillations upon scanning with the edge or the tip of a scanning object.

24 Claims, 3 Drawing Sheets

AUTHENTICITY ATTRIBUTE

FIELD OF THE INVENTION

This invention relates to an authenticity attribute for objects to be protected.

BACKGROUND OF THE INVENTION

A great number of different authenticity attributes are known from the prior art.

Know authenticity attributes include, firstly, attributes which can be recognized by the user of the marked object without any special aids or know-how, such as watermarks, see-through registers, visible and feelable relieflike embossings, colored mottling fibers in bank notes, security threads, outline photogravure and other special printing processes, re-reflective symbols, holograms, hologram-like, embossed, printed or laser-engraved tilting effects and special inks and lacquers with a nacreous or metallic effect.

Secondly, there are attributes which only are accessible to the expert or become recognizable with special equipment. This group of authenticity attributes includes special basic materials such as synthetic fibers and linters in bank notes, mottling fibers, inks and lacquers that e.g. become visible in UV light or change their color by chemically reacting with a secret test substance, security threads with microwriting or radioactive labeling, and individual numberings.

With means for authentication or signature, such as check and identity cards, authenticity attributes furthermore used are the photo and signature of the owner of the object, information stored on microchips and individual secret codes, often in conjunction with encryption methods.

Utility model DE-GM 86 12 236 ("Akustikträger auf Plastikoder Gummizuschnitt") discloses an acoustic carrier wherein an elongate plastic or rubber blank is provided with a sound profile. The sound profile consists of raised and depressed areas extending perpendicular to the longitudinal direction. It can be scanned with the fingernail or a metal foil serving as a pick-up, whereby acoustically perceptible mechanical oscillations are produced. The acoustic carrier is intended for explaining the phenomenon of sound in school instruction.

Further, U.S. Pat. No. 4,121,835 ("Sound Producing Straw") and U.S. Pat. No. 4,631,715 ("Audio Straw and Cup lid") disclose a straw provided with a sound profile and producing acoustic oscillations when pushed through the opening of a beverage cup lid.

U.S. Pat. No. 3,462,157 ("Audible Greeting Card") discloses a talking greeting card having an elongate profiled sound carrier and a scanning apparatus with a scanning needle and diaphragm. Acoustic oscillations are produced by relative motion of sound carrier and scanning apparatus.

U.S. Pat. No. 4,381,558 ("Talking Greeting Card") describes an acoustic carrier in the form of a flat strip ("sound strip") profiled on one side. It is scanned with the fingernail and connected at one end with a greeting card serving as a diaphragm and resonant cavity. U.S. Pat. No. 2,164,663 ("Phonographic Device") and U.S. Pat. No. 2,042,736 ("Talking Device") disclose similar devices for use as advertising media and talking product packages. U.S. Pat. No. 695,159 ("Apparatus for Reproducing Sound") discloses using the sound strip as a doll's voice, with a special scanning apparatus provided instead of the fingernail.

The patent U.S. Pat. No. 2,997,306 ("Book With Talking Pages") finally discloses a book whose pages have an elongate profiled sound carrier. By scanning the sound carrier with a scanning object one sets the pages oscillating audibly. The acoustic information stored on the sound carrier is related in content to the optical information pictured on the page.

In many cases it is important that the user can check the authenticity of the object provided with the authenticity attribute directly without special aids. This applies e.g. to bank notes, identity cards, drugs or computer software. Many known attributes fail to meet this condition and are therefore not fully applicable.

Also, the rapid advances in production and duplicating methods cause the degree of forgery-proofness of most authenticity attributes to decrease constantly so that new authenticity attributes must always be found.

Moreover, the authenticity attribute should often have esthetic appeal, thereby increasing the subjectively perceived value of the object protected by the attribute and simultaneously producing a likewise subjective feeling of security. Examples to be mentioned are the elaborate steel engraving on paper of value and bank notes as well as holograms.

SUMMARY OF THE INVENTION

The invention is based on the problem of providing an authenticity attribute which is firstly difficult to imitate. Secondly, if required, it should be designable so that it can be recognized and checked even by laymen. Furthermore, the authenticity attribute should be universally applicable, also in conjunction with other authenticity attributes. Additionally it should be able to fulfill an esthetic function.

This problem is solved according to the invention by providing the object to be protected with an elongate profile as an authenticity attribute which has raised and depressed areas which, when scanned with the edge or tip of a scanning object, produce mechanical oscillations (co-)determined by the form of the profile. The thus produced mechanical oscillations are preferably convertible into acoustic signals by the scanning object and/or the object to be protected.

The use of an acoustic mark as a security attribute signifies a clear departure from usual practice. For attributes easily checked by the layman one has hitherto relied on optical attributes. For the other attributes acoustic attributes have hitherto played no part either. The prevalence of optical security attributes is readily understandable considering that the classic objects to be protected are printed matter, e.g. bank notes, identity cards and the like. Printing technology as a method of graphic design is very sophisticated.

It is therefore obvious to exploit this high level of development for security technology.

An acoustic attribute in the form of the invention security profile can very well fulfill the functions to be met by a security attribute.

In terms of method, authenticity is tested by moving the scanning object and suthenticity profile relative to each other in the longitydinal direction of the profile. The scanning object thereby engages the profile wholly or partly with its scanning edge or tip. This sets the scanning object and/or the object provided with the profile oscillating.

The existance of certain attributes in the thus produced oscillation pattern serves to prove authenticity. Suitable attributes are e.g. certain sequences of tones or spoken messages. They are relatively easy to check manually without special aids. Moreover, special frequency spectra and the relative phases of the frequency components can for example also be used as characteristic attributes. Such attributes can be proved with suitable aids for oscillation analysis.

BRIEF DESCRIPTION OF THE DRAWINGS

FIG. 4A depicts how a coin may be employed as a scanning object.

DETAILED DESCRIPTION

Figure 1:
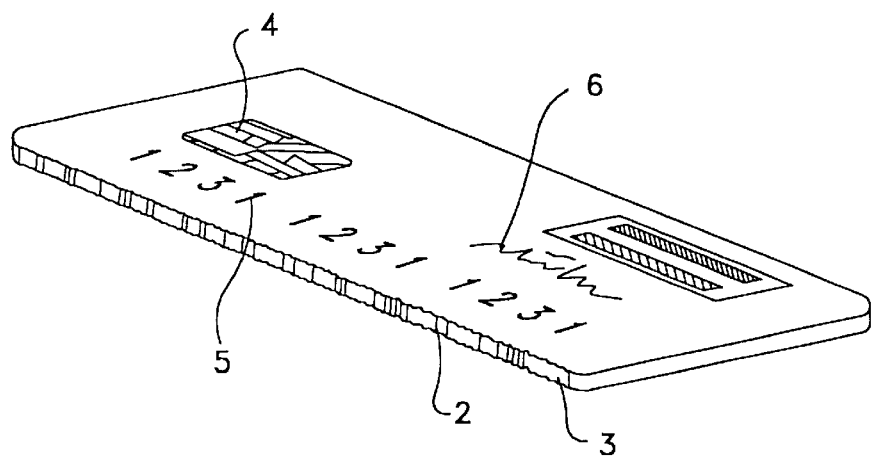
FIG. 1 depicts a credit card having the authenticity attribute of this invention.

In the preferred embodiment the profile is incorporated into a plastic and about one to three decimeters long. This length suffices e.g. to accommodate short spoken information of up to purchase, such as drugs, reagents, foods, microprocessors and other electronic or mechanical components and devices and storage media for electronic data processing. In such cases the user or buyer frequently relies on a trusted trademark and wants to be sure of authenticity. The same applies to products equipped with extensive manufacturer's guarantees.

Many objects desirably provided with an authenticity attribute are formed flat or as hollow bodies. Such objects themselves can perform the function of a diaphragm or resonant cavity, making the mechanical oscillations produced upon scanning clearly audible. This function need then no longer be performed by the scanning object, so that e.g. coins or the fingernail are also suitable scanning objects.

Examples of hollow bodies are packages such as cans, bottles or folding boxes or plastic sheaths as used for computer software, audio and video CDs. Flat objects are e.g. diskettes or CDs. Other conceivable areas of application are cards, such as check cards, credit and debit cards, insurance cards, membership and identity cards, admittance cards, e.g. for buildings, rooms and parking lots, and means of payment in the form of phone, copying and money cards. The cards are preferably made of plastic, at least in the area provided with the authenticity profile. However, the authenticity profile can also be embossed in cardboard in particular for cards to be used only once, such as theater tickets, as described in more detail below.

The packages of watches, jewelry and other objects whose design is frequently forged can likewise be provided with the inventive authenticity attribute. Of course it is also conceivable to provide the objects with the authenticity attribute themselves. For example, a label provided with the inventive sound profile can be sewn into a textile.

Many of the stated objects are made wholly or partly of plastic or another material which can already be provided with the inventive authenticity attribute during production, e.g. by injection molding or embossing. Where this is not possible, one can apply the profile subsequently by embossing. Since authenticity attribute and object consist of one piece here, it is very difficult to separate the authenticity attribute e.g. from an expired check card and mount it on a forgery.

On objects such as papers of value, bank notes, transport and admission tickets or textiles, which are made of rather unsuitable materials for mounting a relief, a strip of a suitable material can be applied to the object by gluing, melting on or other methods. This strip is provided with the profile before, during or after the process of application.

The preferred strip material must be malleable precisely enough during production. Furthermore, it must be hard enough in the finished product to be able to be scanned precisely. Simultaneously it must have sufficient abrasion resistance for the security attribute to be checked without being damaged. Finally, it must in many applications be unbreakable and elastically deformable to a certain degree to be able to be used properly (e.g. in bank notes).

This means that plastic is the preferred strip material. One can use in particular (hard) PVC but also PE, PS, and PP and PC. Through additives one can adapt the material properties further to the special application. In particular the addition of coal dust, as was used e.g. in PVC phonograph records, is suitable for increasing abrasion resistance. A special material composition and the addition of colors and other substances can also further increase forgery-proofness. One can also produce an optical especially appealing authenticity attribute in this way. In this connection it is also conceivable to use materials which, when scanned, produce light, change their color, or produce other optical effects.

Moreover, one can also use glass and ceramic materials, carbon materials, and metals or metal alloys as the strip material.

In the latter types of cards it is often desirable, as with the previously mentioned credit cards, that the inventive authenticity attribute cannot be detached after cancellation of the card and mounted on a forgery. This can be obtained by constructing the card in such a way that it is destroyed upon cancellation or attempted separation, e.g. by providing rated breaking points.

If the quality and durability of the authenticity attribute do not play such a big part for a cardboard object, it is also possible to emboss the profile directly in the cardboard by a cold or hot embossing method. By using lacquered or plastic-laminated cardboards one can improve durability and reproduction quality. Both blind embossing and hot foil embossing are possible methods.

The inventive authenticity attribute can be checked not only by manual handling but also by machine.

In a possible apparatus the authenticity profile and the scanning body can be guided past each other manually or driven by a motor, as in known scanning apparatuses for magnetic stripes on check cards. The mechanical deflections of the scanner are thereby picked up and converted into electric signals. The converter can be constructed e.g. on the principle of the phonograph pick-up. Alternatively one uses a microphone, which can also be located at some distance from the pick-up and sound profile.

Another conceivable apparatus would scan the profile with a light beam and detect the course of the profile from the direction of reflected light. In any case the electric signals are processed electronically and thereby checked for the characteristic attributes, e.g. by comparison with a reference pattern.

To transfer the inventive profile to the object by a molding method such as injection molding or embossing, one must produce a mold. The authenticity profile is produced in a main casting—preferably of steel—with the aid of a milling head accordingly tilted by the inclination angle of the object. Since high accuracies in the range of a few microns can be achieved with milling machines, one can produce a precisely machined authenticity profile in this way. The milling head, which has computer numerical control, is guided at an angle of about 30° to 60° —in particular 45° —to the longitudinal direction of the profiled strip. It has a precision cutting edge rectangular to its rotary axis. The resulting profile consists of raised and depressed areas extending transversely to the longitudinal direction of the profiled strip. Alternatives to the method outlined above are mechanical engraving or lasering.

Depending on the intended scanning speed, i.e. the ratio between profile length and duration of the sound information, one can reproduce frequencies up to about 2 to 5 kHz well with the above-described methods. This permits reproduction of a major part of the characteristic frequencies of vowels, that is, the frequency components in spoken vowels which make them recognizable and distinguishable. However, particularly consonants also contain important frequency components above this range.

In an embodiment of this profile these frequencies are obtained by roughening the corresponding portions of the profile. Suitable methods are e.g. erosion, sandblasting and etching. One thereby takes advantage of the fact that the frequency spectra to be obtained are generally not harmonic frequency spectra but noise. In contrast to the profile produced by milling, roughening produces a stochastic profile which is furthermore uneven transversely to the longitudinal direction of the profiled strip. The frequency spectrum produced by roughening depends on surface parameters such as coefficient of roughness, which can be influenced by the method used for roughening.

From the resulting mold one can produce a plurality of moldings of the profile on the final products either directly or, as was usual e.g. in phonograph records, via one or more intermediate molds.

It should be noted that it is of course also conceivable to incorporate the profile into the object directly, i.e. without molding. This also permits individualization of the security attribute in the sense that the sound profile of each individual object of a series of like or similar objects (e.g. credit cards) can be provided with its own specific information. This is roughly analogous to a serial number known from the prior art, or to owner-specific information such as a name or photo.

In many cases one only achieves effective protection against forgery by combining several authenticity attributes. Bank notes are an example. It is therefore in particular conceivable to use the inventive authenticity attribute in combination with other authenticity attributes.

When choosing the place for mounting the profile one should make sure it is freely accessible for the scanning object, on the one hand, and the scanning object does not rub on a place other than that of the profile, on the other hand. If scanning is done with a straight edge, suitable places of mounting are e.g. the narrow sides of a check card or a bevel. One can also use surfaces convexly curved perpendicular to the longitudinal direction of the profile. If the profile is mounted as a strip on a flat surface which is clearly wider than the profile, however, there is a danger of the scanning edge rubbing on the surface on one side. If the surface is rough this leads to unpleasant interference which impairs reproduction quality. In order to prevent this, one mounts a rib- or band-shaped supporting strip, which is smooth on its side facing the scanning edge, on one side of the profiled strip on the object to be protected, which can be produced e.g. by injection molding or extrusion.

In particular if a pointed object or an object with a narrow straight or greatly curved edge (e.g. the fingernail) is intended as the scanning object, it is advantageous to provide a guide extending parallel to the profile.

FIG. 1 shows a credit card 1 bearing authenticity profile 2 on one of narrow side surfaces 3. It can be scanned with the edge of the fingernail. As a further authenticity attribute the card bears micorprocessor 4, numbering 5 and the owner's signature 6.

Figure 2:
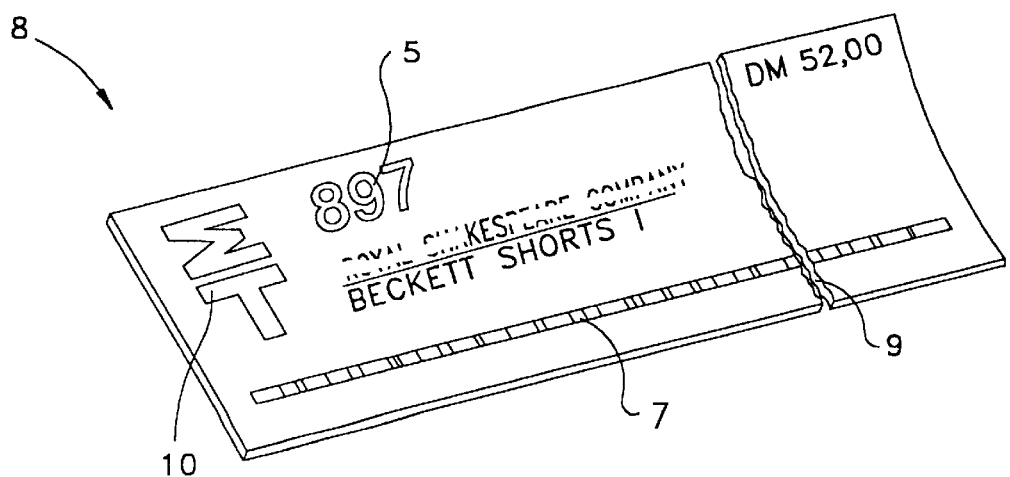
FIG. 2 depicts a printed theater ticket provided with the authenticity attribute of this invention.

FIG. 2 shows a theater ticket 8 provided with inventive authenticity profille 7. Profile 7 is an elongated strip. Ticket 8 and profiled strip 7 are provided with perforation 9 so that upon cancellation of tickey 8 authenticity 7 is destroyed. This prevents the security attribute from being removed after cancellation and applied to a forgery. Additionally ticket 8 is provided with two other authenticity attributes: numbering 5 and hologram 10.

Figure 3:
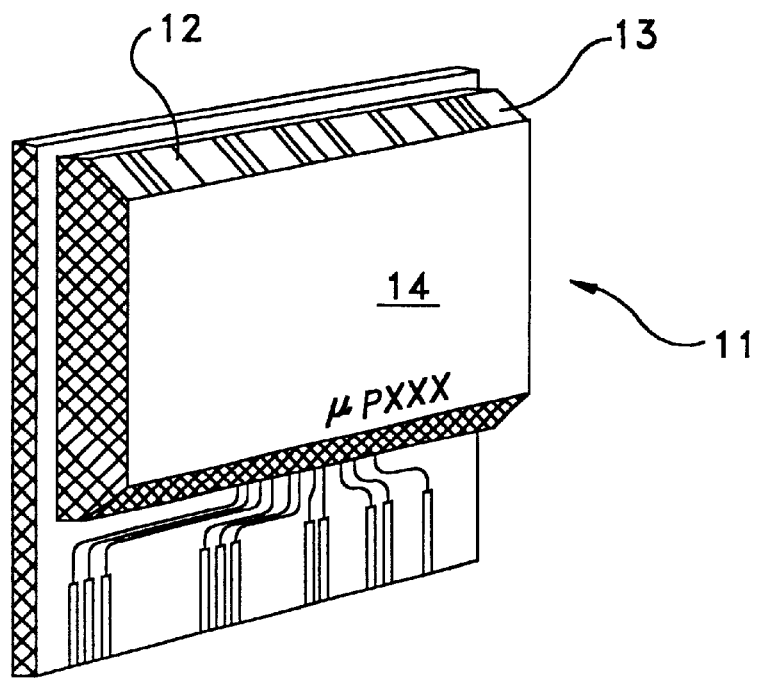
FIG. 3 depicts an integrated circuit component provided with the authenticity attribute of this invention.

FIG. 3 shows a microprocessor 11 bearing an authenticity profile 12 on bevel 13 of base member 14 beveled side surface is of package 14.

Figure 4:
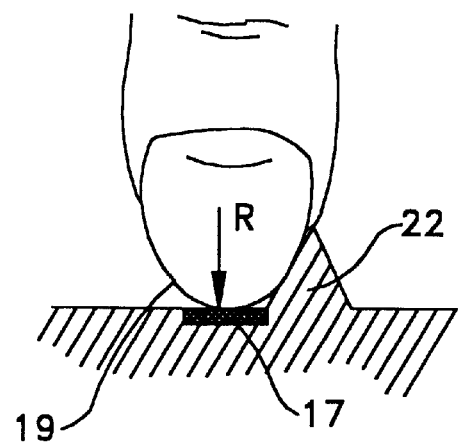
FIG. 4 is a lateral view depicting an authenticity attribute of this invention including a guide.

FIG. 4 shows an example of guide 22 extending parallel to authenticity profile 17 for fingernail 19 to prevent fingernail 19 from slipping as a scannign edge upon scanning. FIG. 4A depicts how a coin 30 may be employed as a scanning object.

Figure 5:
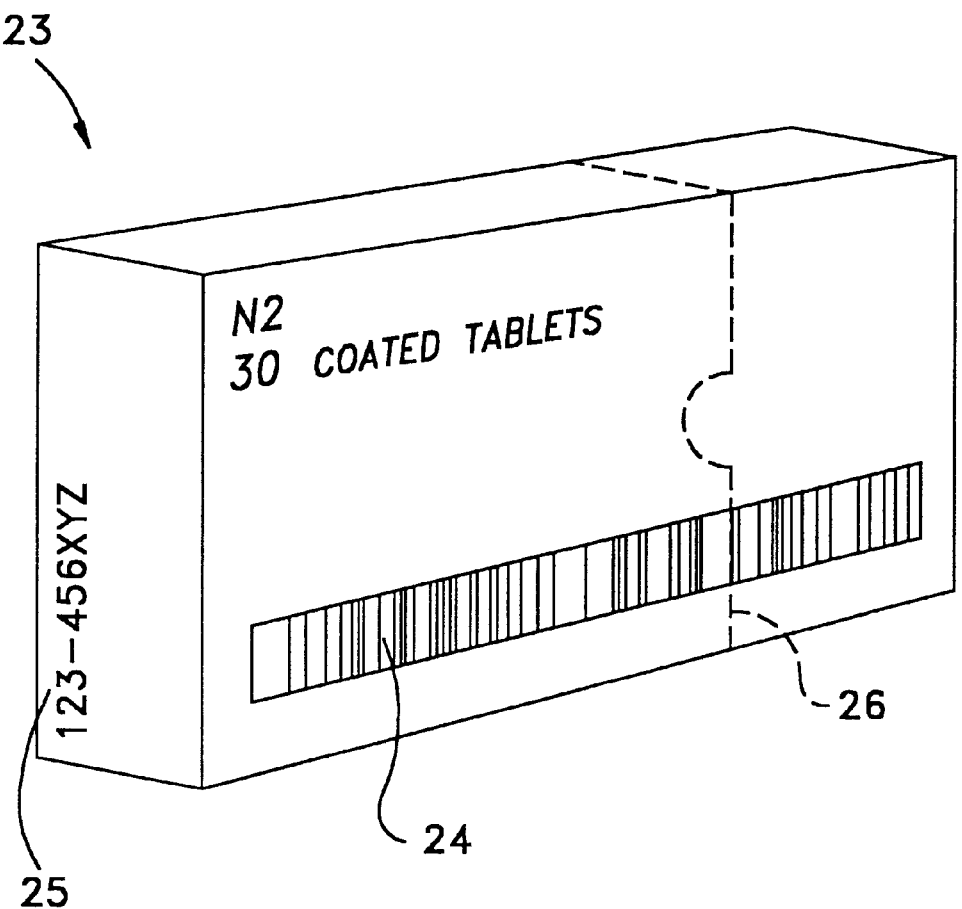
FIG. 5 depicts a box provided with the authenticity attribute of this invention.

FIG. 5 shows a security folding box 23 on whose outside authenticity profile 24 is provided be embossing. As a further authenticity attribute the box bears serial number 25. Perforation 26 ensures that the authenticity profile is destroyed upon opening of the box.

Many high-quality and frequently forged goods, such as the abovementioned drugs, reagents, certain foods, and luxury goods, are offered in folding box packages.

According to the DIHT (German Industrial and Trade Association), about 8% of all products traded worldwide in 1997 were forgeries. The tendency is rising since new possibilities for foegers arise in particular from new distribution channels via Internet and shipping.

The example of application in FIG. 5 specifically shows a box for drugs. Drug forereies alone damage the pharmaceutical industry to the amount of several billion dollars annually, quite apart form the consequences for the users' health.

The authenticity attribute is mounted on the outside of the package so that it can already be checked upon purchase of the product without the box having to be opened. As with the theater ticket (FIG. 2), the profiled strip is mounted so as to be destroyed upon opening. This prevents forgers from collecting empty packages and refilling them.

The security folding box surprisingly exploits three properties of the new security attribute together with three special properties of the folding box:

1. Tests have shown that the authenticity attribute can be incorporated into the package cardboard by simple embossing in the way described above. This is surprising since not every cardboard is suitable for this. The cardboard must have both sufficient thickness and a sufficiently smooth surface. Amazingly, folding box cardboard meets these conditions because it is firstly thick enough for reasons of package stability. Secondly it is usually provided with a coating and/or lacquering, for protection against moisture and for esthetic reasons. This has turned out to produce a sufficiently smooth surface for the inventive authenticity profile.

2. Further tests have shown in that many machines used for punching out the folding box are also suitable for embossing the inventive security attribute. This permits the security attribute to be provided in one operation with punching, making mass production incomparably inexpensive.

3. It has turned out that when the security attribute is scanned the folding box acts as a resonant cavity which further amplifies the sound. This permits the inventive security attribute to be checked even in relatively noisy surroundings or by users with poor hearing.

Summing up, the inventive profiled strip thus offers a surprisingly inexpensive, elegant and safe solution in this application.

What is claim is:

1. A box, said box including:

paperboard shaped to form an enclosure for holding goods, the enclosure having an outer surface with at least one exposed face and wherein said paperboard is provided with a perforation along the exposed face along which the exposed face is separated;

printed identification of the goods held in said box on the outer surface of the enclosure; and an authenticity attribute attached to the exposed face of the enclosure, said authenticity attribute having a plurality of raised and lowered sections that are collectively formed together so that, when a scanning object is passed along said authenticity attribute, vibrations are produced that generate distinct acoustic pattern wherein, said authenticity attribute is attached to the exposed face of the enclosure so as to be located on opposed sides of the perforation.

2. The box of claim 1, wherein said authenticity attribute is an elongated strip of material that is attached to a portion of said paperboard that forms the exposed surface.

3. The box of claim 1, wherein said authenticity attribute is formed integrally as part of said paperboard.

4. A method for providing a means to determine the authenticity of an article, said method comprising the steps of:

providing an article, the article having an outer surface;

providing an elongated strip with raised and depressed sections that are adjacent each other and the strip is formed so that, when a scanning object is run along the raised and depressed sections, acoustic oscillations having a distinct sound pattern are produced and wherein the elongated strip is further formed so that the scanning object that is used to produce the acoustic vibrations is a fingernail or a coin; and integrally securing the elongated strip to the outer surface of the article.

5. The method for producing a means to determine the authenticity of an article of claim 4, wherein, a set of contiguous raised and depressed sections are formed on the outer surface of the article in a select patterns so that the raised and depressed sections collectively form the elongated strip.

6. The method for producing a means to determine the authenticity of an article of claim 4, wherein: the elongated strip is formed as a component separate from the article; and the elongated strip is secured to the article.

7. The method for producing a means to determine the authenticity of an article of claim 4, wherein: the article is formed with a perforation along which the article is separated into plural sections; and the elongated strip is secured to the article so that a first portion of the elongated strip is located adjacent a first side of the perforation and a second portion of the elongated strip is located adjacent a second side of the perforation opposite the first side.

8. The method for producing a means to determine the authenticity of an article of claim 4, further including the step of providing a guide on the outer surface that is raised relative to the outer surface of the article and that is adjacent and parallel to the elongated strip along at least a portion of the strip.

9. The method of producing a means to determine the authenticity of an article of claim 4, wherein, the elongated strip is formed so that the acoustic pattern produced when the scanning object is run along the elongated strip consists of one from the group consisting of: distinct tones; and a spoken message.

10. The method of producing a means to determine the authenticity of an article of claim 4, wherein:

the article is a piece of plastic having opposed faces surfaces and at least one exposed side surface that extends between the opposed faces; and the exposed side surface of the plastic is shaped to have variable surface heights so that the side surface is the elongated strip.

11. The method of producing a means to determine the authenticity of an article of claim 4, wherein the article is a package in which goods are contained.

12. The method of producing a means to determine the authenticity of an article of claim 4, further including the steps of:

passing a fingernail or a coin along the elongated strip so as to cause the production of acoustic vibrations; and analyzing the sounds produced by the acoustic vibrations by converting the sounds into electrical signals and verifying the accuracy of sounds with a machine.

13. The method of producing a means to determine the authenticity of an article of claim 11, wherein:

the package is a box formed from cardboard; and in a single step, the cardboard is formed into the folding box and portion of the cardboard is embossed to form the elongated strip on the box.

14. A printed article, said article including:

a piece of planar material capable of carrying printing, said planar material being formed with a perforation so as to allow said planar material to be separated into two separate pieces;

printing on at least one surface of said planar material; and an authenticity attribute attached to said planar material, said authenticity attribute having a contiguous set of raised and lowered sections that are arranged so that, when a scanning object is passed along the side surface, vibrations are produced that generate distinct acoustic pattern wherein, said authenticity attribute is disposed on said planar material so as to extend across the perforation formed in said planar material.

15. The printed article of claim 14, wherein said planar material is one selected from the group consisting of: cardboard; and plastic.

16. An authenticity attribute for an object to be protected, said attribute including:

an elongated strip with opposed longitudinal sides and raised and lowered surfaces, the surfaces being shaped so shaped so that, when a scanning object is passed over the surfaces, a sequence of tones or a spoken message is produced; and a guide located adjacent one of the sides of said strip, said guide positioned relative to said strip so that when the scanning object abuts said guide, the scanning object is aligned over the raised and lowered surfaces of said strip.

17. A method for providing a means to determine the authenticity of an article, said method comprising the steps of:

provide an article, the article having an outer surface that has a perforation along which the article can be separated into plural sections; and integrally securing to the outer surface of the article an elongated strip with raised and depressed sections that are adjacent each other and the strip formed so that, when a scanning object is run along the raised and depressed sections, acoustic oscillations having a distinct sound pattern are produced wherein, the elongated strip is secured to the article so that a first portion of the strip is located adjacent a firt side of the perforation and a second portion of the strip is located and adjacent a second side of the perforation opposite the first side.

18. The method for providing a means to determine the authenticity of an article of claim 17, wherein the elongated strip is formed so that the scanning object used to produce the acoustic oscillations is a fingernail or a coin.

19. The method for producing a means to determine the authenticity of an article of claim 17, wherein, a set of contiguous raised and depressed sections are formed on the surface of the article that collectively form the elongated strip.

20. The method for producing a means to determine the authenticity of an article of claim 17, wherein: the elongated strip is formed as a component separate from the article; and the elongated strip is secured to the article.

21. A method for determining the authenticity of an article, said method comprising the steps of:

providing an article, the article having an outer surface;

integrally securing to the outer surface of the article an elongated strip with raised and depressed sections that are adjacent each other and the elongated strip formed so that, when a fingernail is run along the raised and depressed sections, acoustic oscillations having a distinct sound pattern are produced;

manually passing a fingernail along the elongated strip so as to cause the productions of acoustic vibrations; and analyzing sounds produced by the acoustic vibrations with the human ear to determine if the distinct sound pattern is produced.

22. The mehtod for determining the authenticity of an article of claim 21, wherein, a set of contagious raised and depressed sections are formed on the surface of the article that collectively form the elongated strip.

23. The method for determining the authenticity of an article of claim 21, eherein: the elongated strip is formed as a component separate from the article; and the elongated strip is secured to the article.

24. A method for providing a means to determine the authenticity of an article, said method comprising the steps of:

providing an article, the article having an outer surface;

integrally securing to the outer surface of the article an elongated strip with raised and depressed sections that are adjacent each other and the strip formed so that, when a scanning object is run along the raised and depressed sections, acoustic oscillations having a distinct sound pattern are produced; and providing a guide on the outer surface of the article that is raised relative to the outer surface and that is adjacent and parallel to the elongated strip along at least a portion of the strip.

* * * * *